United States Patent
Chou

(10) Patent No.: US 7,211,214 B2
(45) Date of Patent: May 1, 2007

(54) LASER ASSISTED DIRECT IMPRINT LITHOGRAPHY

(75) Inventor: Stephen Y. Chou, Princeton, NJ (US)

(73) Assignee: Princeton University, Monmouth, NJ (US)

( * ) Notice: Subject to any disclaimer, the term of this patent is extended or adjusted under 35 U.S.C. 154(b) by 201 days.

(21) Appl. No.: 10/390,406

(22) Filed: Mar. 17, 2003

(65) Prior Publication Data

US 2004/0046288 A1    Mar. 11, 2004

Related U.S. Application Data

(60) Continuation-in-part of application No. 10/140,140, filed on May 7, 2002, which is a division of application No. 09/618,174, filed on Jul. 18, 2000, now Pat. No. 6,482,742, application No. 10/390,406, which is a continuation-in-part of application No. 10/244,276, filed on Sep. 16, 2002, which is a continuation of application No. 10/046,594, filed on Oct. 29, 2001.

(60) Provisional application No. 60/364,653, filed on Mar. 15, 2002.

(51) Int. Cl.
    *B29C 59/16*    (2006.01)

(52) U.S. Cl. ............... 264/446; 264/479; 264/482; 264/293; 264/337; 164/48; 164/91

(58) Field of Classification Search .......... 264/446, 264/479, 482, 293, 337; 164/48, 91
    See application file for complete search history.

(56) References Cited

U.S. PATENT DOCUMENTS 3,615,389 A    10/1971    Newberry .............. 96/1.1
(Continued)

FOREIGN PATENT DOCUMENTS

WO    WO 93/21671    10/1993

OTHER PUBLICATIONS

Kamins, T.I., "Positioning of Self-Assembled, single-crystal, germanium islands by silicon nanoimprinting" Applied Physics Letter, vol. 74, No. 12, Mar. 22, 1999.
(Continued)

*Primary Examiner*—Suzanne E. McDowell
(74) *Attorney, Agent, or Firm*—Polster, Lieder, Woodruff & Lucchesi, LC.

(57) ABSTRACT

In accordance with the invention, features can be directly imprinted into the surface of a solid substrate. Specifically, a substrate is directly imprinted with a desired pattern by the steps of providing a mold having a molding surface to imprint the pattern, disposing the molding surface adjacent or against the substrate surface to be imprinted, and irradiating the substrate surface with radiation to soften or liquefy the surface. The molding surface is pressed into the softened or liquefied surface to directly imprint the substrate. The substrate can be any one of a wide variety of solid materials such as semiconductors, metals, or polymers. In a preferred embodiment the substrate is silicon, the laser is a UV laser, and the mold is transparent to the UV radiation to permit irradiation of the silicon workpiece through the transparent mold. Using this method, applicants have directly imprinted into silicon large area patterns with sub-10 nanometer resolution in sub-250 nanosecond processing time. The method can also be used with a flat molding surface to planarize the substrate.

45 Claims, 6 Drawing Sheets

U.S. PATENT DOCUMENTS

| | | | |
|---|---|---|---|
| 4,272,473 | A | 6/1981 | Riemersma et al. |
| 4,287,235 | A | 9/1981 | Flanders |
| 4,510,005 | A | 4/1985 | Nijman ........................ 156/221 |
| 4,512,848 | A | 4/1985 | Deckman et al. |
| 4,543,225 | A | 9/1985 | Beaujean |
| 4,752,498 | A | 6/1988 | Fudim ........................ 427/54.1 |
| 4,761,253 | A * | 8/1988 | Antes ........................ 264/1.31 |
| 4,854,771 | A | 8/1989 | Corbin, Jr. et al. ............ 404/79 |
| 5,078,947 | A | 1/1992 | Nishizawa et al. .......... 264/1.1 |
| 5,202,206 | A | 4/1993 | Tam ............................ 430/41 |
| 5,259,926 | A | 11/1993 | Kuwabara et al. |
| 5,338,396 | A | 8/1994 | Abdala et al. |
| 5,348,616 | A | 9/1994 | Hartman et al. ............. 156/643 |
| 5,358,604 | A | 10/1994 | Lin et al. .................... 156/664 |
| 5,425,848 | A | 6/1995 | Haisma et al. |
| 5,434,107 | A | 7/1995 | Paranjpe |
| 5,471,455 | A | 11/1995 | Jabr |
| 5,477,024 | A | 12/1995 | Share et al. ........... 219/121.69 |
| 5,503,963 | A | 4/1996 | Bifano |
| 5,638,355 | A | 6/1997 | Jabr |
| 5,682,453 | A | 10/1997 | Daniel et al. ................. 385/99 |
| 5,792,411 | A | 8/1998 | Morris et al. ............... 264/400 |
| 5,843,486 | A | 12/1998 | Kurosaki et al. ........... 425/174 |
| 5,948,289 | A | 9/1999 | Noda et al. ............ 219/121.69 |
| 6,165,911 | A | 12/2000 | Calveley |
| 6,245,479 | B1 | 6/2001 | Etzel ........................... 430/200 |
| 6,342,178 | B1 * | 1/2002 | Matsuoka et al. .......... 264/496 |
| 6,376,017 | B1 | 4/2002 | Kaule et al. |
| 6,627,376 | B1 | 9/2003 | Ueno .......................... 430/269 |
| 6,656,409 | B1 | 12/2003 | Keicher et al. ............. 264/401 |
| 6,656,668 | B2 | 12/2003 | Tsai et al. .................... 430/396 |
| 2001/0008715 | A1 | 7/2001 | Lin et al. .................... 428/694 |
| 2002/0041742 | A1 | 4/2002 | Bernard et al. ............... 385/96 |
| 2002/0051864 | A1 | 5/2002 | Katoh et al. ................ 428/138 |
| 2003/0152756 | A1 | 8/2003 | Yamada et al. ............. 428/210 |
| 2003/0175427 | A1 | 9/2003 | Loo et al. .................... 427/256 |
| 2004/0065976 | A1 | 4/2004 | Sreenivasan et al. .... 264/171.1 |
| 2004/0110856 | A1 | 6/2004 | Young et al. ................... 522/6 |
| 2004/0112862 | A1 | 6/2004 | Willson et al. ............... 216/66 |
| 2004/0142150 | A1 | 7/2004 | Bharadwaj et al. ......... 428/167 |
| 2004/0239007 | A1 * | 12/2004 | Arai et al. .................. 264/482 |

OTHER PUBLICATIONS

Wang, J., et al., "Fabrication of a new broadband waveguide polarizer with a double-layer 190 nm period metal-gratings using nanoimprint lithography" J. Vac. Sci. Technol. B17 (6) Nov./Dec. 1999.

Tan, H., et al., "Roller Nanoimprint Lithography" Vac. Sci. Technol. B 16 (6) Nov./Dec. 1998.

Feynman, Richard, "There's Plenty of Room at the Bottom-An Invitation to Enter a New Field of Physics" talk delivered at the annual meeting of the American Physical Society at the California Institute of Technology (Caltech) in 1959, published in Feb. 1960 issue of Caltech's "Engineering and Science".

Flanders, D.C., "X-ray Lithography at ~ 100 A linewidths using x-ray masks fabricated by shadowing techniques" Journal of Vacuum Science and Technology, 16 (6), Nov./Dec. 1979 (received Jun. 11, 1979), pp. 1615 to 1619, published American Vacuum Society, USA.

Jorritsma et al., "Fabrication of large arrays of metallic nanowires on V-grooved substrates" Applied Physics Letters 67 (10), Sep. 4, 1995 (received May 16, 1995), pp. 1489-1491, published by American Institute of Physics, USA.

Aumiller et al., "Submicrometer Resolution Replication of Relief Patterns for Integrated Optics", J. Appl. Phys., vol. 45, pp. 4557-4562, (1974).

Nisper, "Injection-molded replication of binary optic structures", SPIE v2600 Oct. 23-24, 1995 p. 56-64 0227-786X.

Shvartsman, "Holographic optical elements by dry photopolymer embossing" SPIE (1991) 1461 (pract. Holog. S) pp. 313-320.

"Fabrication of submicron crossed square wave gratings by dry etching and thermoplastic replication techniques" JVST B vol. 1, No. 4, Dec. 1983 pp. 1207-1210.

Healey et al., "Photodeposition of Micrometer-scale polymer patterns on optical imaging Fibers" Science vol. 269, Aug. 1995, pp. 1078-1080.

Supplementary European Search Report dated May 9, 2006.

* cited by examiner

LASER ASSISTED DIRECT IMPRINT LITHOGRAPHY

CROSS REFERENCE TO RELATED APPLICATIONS

This application claims the benefit of U.S. Provisional Patent Application No. 60/364,653 filed by Stephen Chou on Mar. 15, 2002 and entitled "A Method for Direct Imprint of Microstructures in Materials".

This application is also a continuation-in-part of U.S. patent application Ser. No. 10/244,276 filed by Stephen Chou on Sep. 16, 2002 and entitled "Lithographic Method For Molding Pattern With Nanoscale Features" which, in turn, is a continuation of U.S. application Ser. No. 10/046,594 filed by Stephen Chou on Oct. 29, 2001, which claims priority to U.S. patent application Ser. No. 09/107,006 filed by Stephen Chou on Jun. 30, 1998 (now U.S. Pat. No. 6,309,580 issued Oct. 30, 2001) and which, in turn, claims priority to U.S. application Ser. No. 08/558,809 filed by Stephen Chou on Nov. 15, 1995 (now U.S. Pat. No. 5,772,905 issued Jun. 30, 1998). All of the foregoing Related Applications are incorporated herein by reference.

This application is a continuation-in-part of U.S. patent application Ser. No. 10/140,140 filed by Stephen Chou on May 7, 2002 and entitled "Fluid Pressure Imprint Lithography" which, in turn, is a Divisional of U.S. patent application Ser. No. 09/618,174 filed by Stephen Chou on Jul. 18, 2000 and entitled "Fluid Pressure Imprint Lithography" (now U.S. Pat. No. 6,482,742 issued Nov. 19, 2002).

STATEMENT OF GOVERNMENT INTEREST

This invention was made with government support under DARPA (N66001-98-1-8900) and ONR (N00014-01-1-0741). The government has certain rights to this invention.

FIELD OF THE INVENTION

This invention relates to imprint lithography and, in particular, to laser assisted direct imprint lithography (LADI) wherein laser radiation permits direct imprinting of a mold on a substrate surface. The process is particularly useful in directly imprinting nanoscale features on solid substrates.

BACKGROUND OF THE INVENTION

Methods of patterning small features onto substrates are of great importance in the fabrication of many electronic, magnetic, mechanical, and optical devices as well as devices for biological and chemical analysis. Such methods are used, for example, to define the features and configurations of microcircuits and the structure and operating features of planar optical waveguides and associated optical devices.

Optical lithography is the conventional method of patterning such features. A thin layer of photoresist is applied to the substrate surface and selected portions of the resist are exposed to a pattern of light. The resist is then developed to reveal a desired pattern of exposed substrate for further processing such as etching. A difficulty with this process is that resolution is limited by the wavelength of the light, scattering in the resist and substrate, and the thickness and properties of the resist. As a consequence optical lithography becomes increasingly difficult as desired feature size becomes smaller. Moreover applying, developing and removing resists are relatively slow steps, limiting the speed of throughput.

A more recent approach to patterning small features is nanoimprint lithography wherein a nanofeatured molding surface is imprinted into a resist or resist-like material (polymer) and the imprinted pattern is removed to selectively expose the substrate surface. This process eliminates the limitations on resolution caused by the wavelength of light, but nonetheless has limitations imposed by the use and processing of resists or polymers. Further details concerning nanoimprint lithography are set forth in applicant's U.S. Pat. No. 5,772,905 issued Jun. 30, 1998 and entitled "Nanoimprint Lithography" and U.S. Pat. No. 6,482,742 issued Nov. 19, 2002 and entitled "Fluid Pressure Imprint Lithography". The '905 and '742 patents are incorporated herein by reference.

The electronics and optical communications industries, as well as companies entering new fields of nanotechnology, continue to seek new methods for the production of microcircuits, optical devices and new nanoscale structures. In particular they seek faster processes for patterning substrates with higher resolution patterns.

SUMMARY OF THE INVENTION

In accordance with the invention, features can be directly imprinted into the surface of a solid substrate. Specifically, a substrate is directly imprinted with a desired pattern by the steps of providing a mold having a molding surface to imprint the pattern, disposing the molding surface adjacent or against the substrate surface to be imprinted, and irradiating the substrate surface with radiation to soften or liquefy the surface. The molding surface is pressed into the softened or liquefied surface to directly imprint the substrate. The substrate can be any one of a wide variety of solid materials such as semiconductors, metals, or polymers. In a preferred embodiment the substrate is silicon, the laser is a UV laser, and the mold is transparent to the UV radiation to permit irradiation of the silicon workpiece through the transparent mold. Using this method, applicants have directly imprinted into silicon large area patterns with sub-10 nanometer resolution in sub-250 nanosecond processing time. The method can also be used with a flat molding surface to planarize the substrate.

BRIEF DESCRIPTION OF THE DRAWINGS

The advantages, nature and various additional features of the invention will appear more fully upon consideration of the illustrative embodiments shown in the accompanying drawings described in detail below. In the drawings.

It is to be understood that these drawings are for the purposes of illustrating the concepts of the invention and, except for the graph, are not to scale.

DETAILED DESCRIPTION

Figure 1:
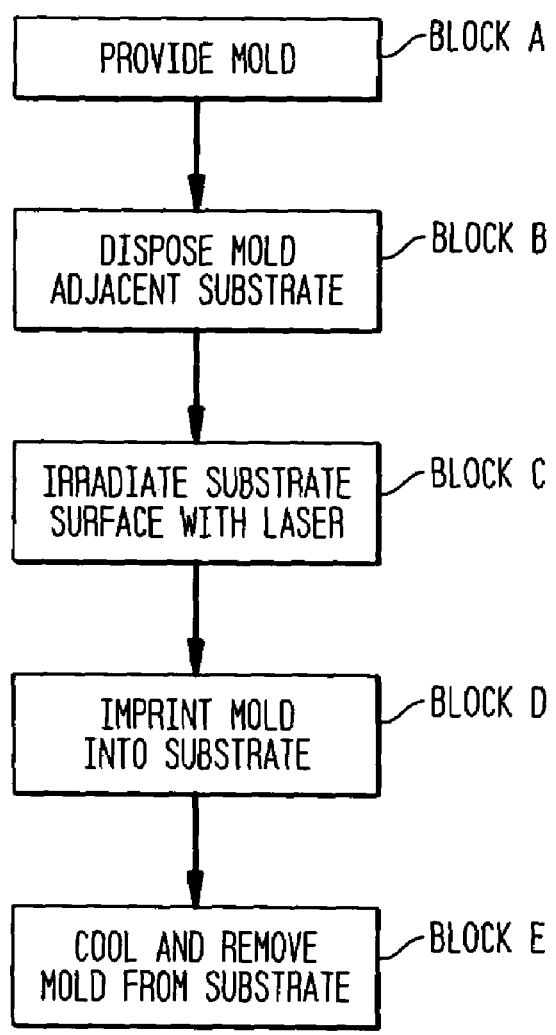
FIG. 1 is a schematic flow diagram showing the steps involved in laser assisted direct imprint lithography.

Referring to the drawings, FIG. 1 is a schematic block diagram showing the steps involved in laser assisted direct imprinting a desired pattern into the surface of a substrate without the interposition of a resist or polymer material. The first step shown in Block A is to provide a mold having a molding surface to imprint the desired pattern.

The next step, Block B, is to dispose the mold with the molding surface adjacent the substrate surface to be imprinted. The molding surface can be pressed against the substrate surface.

Figure 2A:
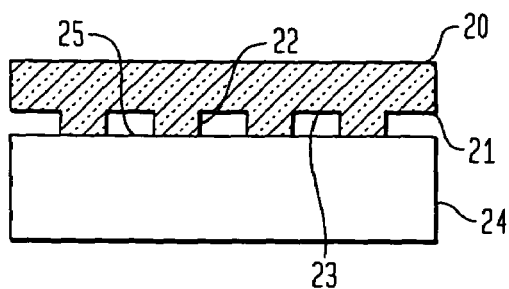
FIGS. 2A–2C show the mold and substrate at various stages of the FIG. 1 process.

FIG. 2A shows the mold 20 having a molding surface 21 comprising one or more projecting features 22 and one or more recessed regions 23. The mold 20 is disposed near a substrate 24 having a surface 25 to be imprinted. The molding surface 21 is adjacent the surface 25.

The substrate 24 can be any material that will soften or liquefy in response to laser radiation and return to its original state when the laser exposure is terminated. The mold 20 is advantageously composed of a material transparent to the laser radiation so that the substrate surface 25 can be irradiated through the mold.

The molding surface 21 can have microscale or nanoscale features. Advantageously the surface comprises a nanofeatured pattern having at least one feature with a minimum dimension of less than 200 nanometers, for example the lateral dimension of a projecting feature 22 can be less than 200 nanometers. Also advantageously, the molding surface presents a mold depth of less than 250 nanometers, i.e. the distance between the outer portion of a projecting feature 22 and the inner portion of an adjacent recessed region 23 can be less than 250 nanometers and preferably in the range 5–250 nanometers. For planarizing the substrate surface, however, the molding surface is advantageously flat.

In a preferred embodiment, the substrate is silicon, the laser is a UV laser, and the mold is a fused quartz. A typical mold can be composed of 1 millimeter thick fused quartz having patterns with features ranging in size from 10 nanometers or less to tens of microns. Other advantageous substrates include other semiconductors, metals, semimetals, polymers and ceramics.

The substrate surface layer to be molded can be a multi-layered structure of thin films of material selected among semiconductors, metals, semimetals, polymers and insulators. The surface can also be an alloy or a ceramic. The surface layer can also be composed of plural surface regions, different surface regions formed of different materials.

The third step (Block C) is to irradiate the substrate surface to be molded with radiation to soften or liquefy the surface.

Figure 2B:
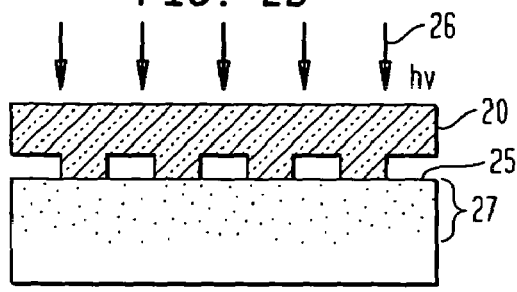

FIG. 2B illustrates a preferred arrangement for irradiation wherein radiation 26 from a source (not shown) passes through the mold 20 to irradiate surface 25 of the substrate. The laser radiation, which can be laser radiation, forms a softened or liquefied surface region 27 on the substrate 24.

Useful radiation sources include lasers (ultraviolet, infra-red and visible light) and lamps (narrow band and broad spectrum). Laser radiation is advantageously in the range 1 nanometer to 100 micrometers. Lamp radiation is advantageously in the range 1 nanometer to 50 micrometers. The irradiation can be pulsed, advantageously with a time duration in the range 1 nanosecond to 10 seconds.

The next step shown in Block D of FIG. 1 is to imprint the substrate by pressing the molding surface into the softened or liquefied surface region.

This pressing can be accomplished by a mechanical press as described in the aforementioned U.S. Pat. No. 5,772,905, by fluid pressure as described in U.S. Pat. No. 6,482,742 or by any other method of applying force. The pressure can be applied beginning prior to the irradiation. One advantageous approach is to press the mold against the substrate and, during the pressing, irradiate the substrate surface with a plurality of pulses.

Figure 2C:
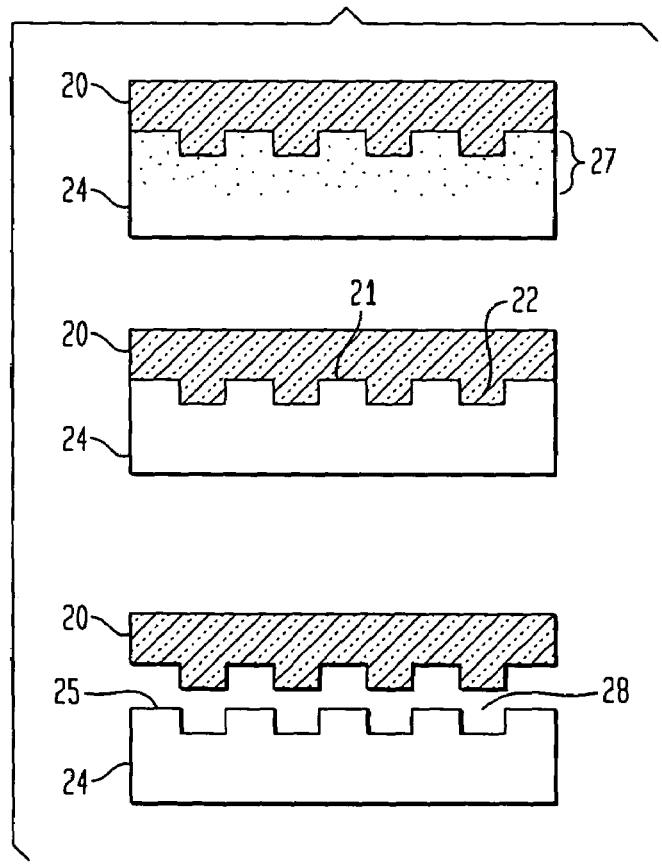

FIG. 2C shows the substrate with the molding surface 21 imprinting the surface region 27.

To complete the imprinting process, the irradiation is terminated as by switching off the source, the surface region is permitted to cool slightly, and the molding surface is removed from the substrate.

FIG. 2C illustrates the mold 20 removed from the substrate 24, leaving the imprinted mold pattern 28 on the substrate surface 25.

The invention may now be more clearly understood by consideration of the following specific examples:

EXAMPLE

A series of experiments were conducted using molds having the following three patterns: (1) grating of 140 linewidth, 110 nm depth, and 300 nm period; (2) lines 10 nm wide and 15 nm deep, which were created due to the trenching effect in reactive ion etching during mold fabrication; and (3) rectangles of length and width in tens of microns and a depth of 110 nm. All three patterns were imprinted directly in silicon in the same LADI process.

First, a quartz mold, as described above, was brought into contact with a silicon substrate. Two large press plates were used to supply the force which pressed the mold against the substrate. The silicon wafer was placed on the lower plate with the mold on top of the wafer. The top plate, also made of fused quartz and hence transparent to the laser beam, was placed on top of the mold. The two plates were pressed together by increasing the pressure provided by screws between the two large plates. The preferred level of pressure applied to bring the mold and the substrate into contact was approximately $1.7 \times 10^6$ Pa or about 17 atmospheres pressure. This pressure level produces an imprint depth of ~110 nm in an imprint time of ~250 ns. It is preferable to have the pressure applied before introduction of the laser pulse.

Next, a laser pulse was applied to the mold-substrate assembly. In one experiment, a single XeCl excimer laser pulse having a wavelength of 308 nm, a pulse duration of 20 ns at FWHM, and a fluence of 1.6 J/cm$^2$, was applied to the assembly. The laser passed through the quartz mold with very little energy absorbed by the mold. The transmittance of the mold for the laser radiation was measured and found it to be ~93%. The difference in refractive index at the two mold-air interfaces caused a total radiation reflection of ~7% indicating the mold itself does not absorb the laser radiation.

The single laser pulse irradiates the silicon surface, inducing the melting and liquefying the silicon for approximately 250 ns. Advantageously, the melting of the substrate surface can be monitored in situ during the LADI process by measuring the time-resolved reflectivity of a laser beam from the substrate surface. Reflectivity is the ratio of the energy of a wave reflected from a surface to the energy possessed by the wave striking the surface. When silicon melts, it changes from a semiconductor to a metal and the silicon's surface reflectivity to visible light increases by a factor of two.

Figure 3:
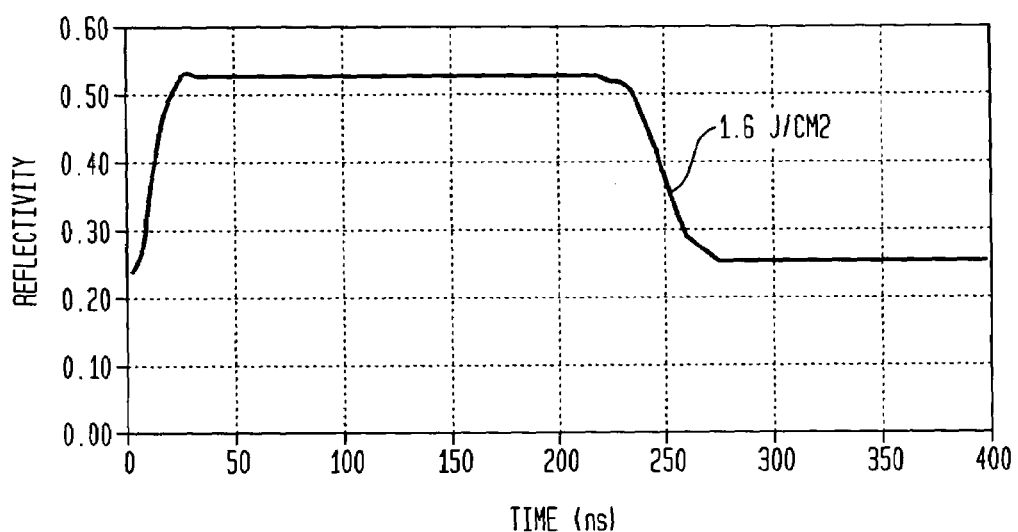
FIG. 3 is a graph plotting the reflectivity of a HeNe laser beam from the silicon surface as a function of the time when the silicon surface is irradiated.

In one experiment, a HeNe laser beam having a wavelength of 633 nm was used to measure the reflectivity. FIG. 3 shows the measured reflectivity of a silicon surface exposed to a single 20 ns XeCl excimer laser pulse at a fluence of 1.6 J/cm$^2$. As shown by the graph, the reflectivity of solid silicon is approximately 0.25. Under the radiation, the reflectivity of the silicon surface increased rapidly in the first 25 ns, saturated for 200 ns at a reflectivity of approximately 0.50, and returned to the original solid silicon reflectivity in 50 ns.

While the substrate was in a liquid state the mold was embossed into the liquid substrate layer. The low viscosity of molten silicon enables the molten silicon to flow rapidly into all crevasses, filling them completely and conforming to the mold. The melting period of the silicon is approximately equivalent to 20 ns, the duration of the laser pulse. In FIG. 3, the 25 ns raising edge of the reflectivity, which is slightly longer than the pulse duration, might be related to the RC time constant of the oscilloscope (100 MHz), which is 10 ns.

The mold and the substrate were then separated, leaving a negative profile of the mold pattern imprinted on the substrate surface. Typically, the transformation from liquid to solid causes the substrate volume to expand about 3% in each direction which may aid the conformation of the substrate to the mold features for achieving sub-10 nm resolution. It is desirable to separate the substrate and the mold easily, so not to damage either the imprinted features in the substrate or the features of the mold. Experimentation shows the separation is aided by the fact that the quartz mold has a lower coefficient of thermal expansion ($5\times10^{-7}K^{-1}$) than silicon ($2.5\times10^{-6}K^{-1}$).

Figure 4:
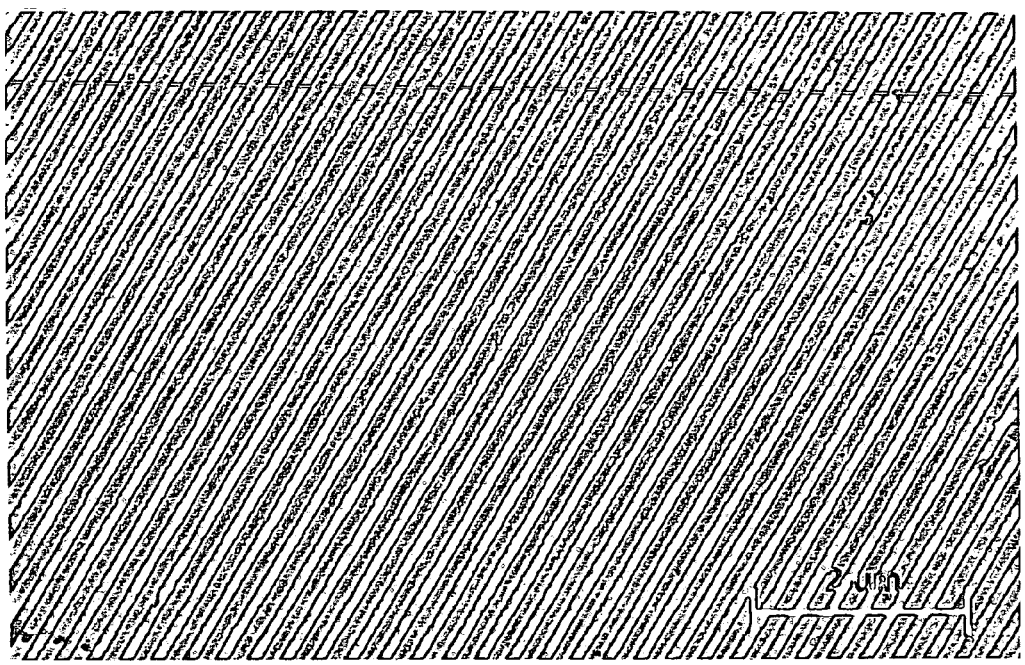
FIG. 4 illustrates a scanning electron micrograph of an imprinted silicon grating.
Figure 5A:
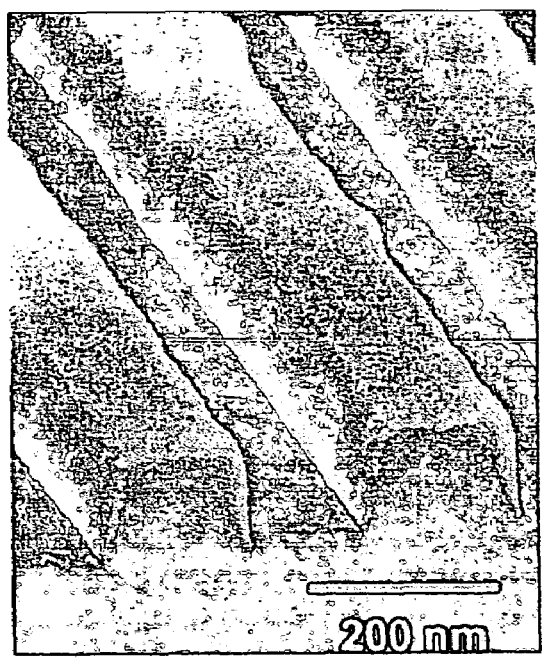
FIG. 5(a) is a scanning electron micrograph of a cross-sectional view of a quartz mold.
Figure 5B:
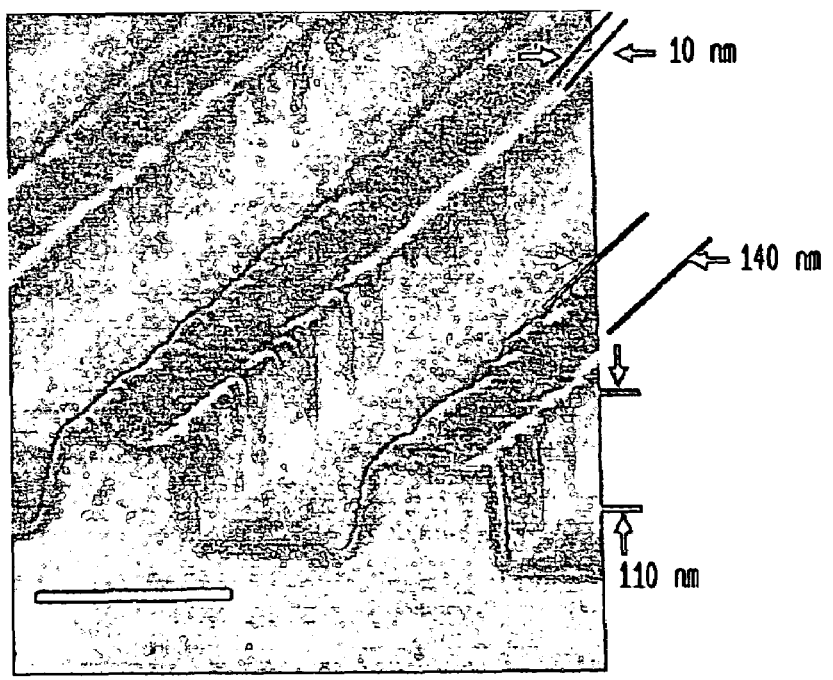
FIG. 5(b) is a scanning electron micrograph of a cross-sectional view of a silicon substrate imprinted by the method of FIG. 1.

FIG. 5(A) is a scanning electron micrograph showing a cross-sectional view of a quartz mold. FIG. 4 and FIG. 5(B) are scanning electron micrographs showing a top and cross-sectional view, respectively, of the features imprinted in a silicon substrate as a result of LADI. The imprinted grating resulting from LADI has a 140 nm linewidth, 110 nm depth and 300 nm period, which is consistent with the features of the mold One of the most interesting features in FIG. 5(B) is the ridge formed along the top corners on the imprinted grating lines. These ridges are approximately 10 nm wide and 15 nm high. A comparison to the scanning electron micrograph of the mold in FIG. 5(A) clearly indicates that these ridges come from the notches formed in the mold caused by the trenching effect of the reactive ion etching of the mold. The complete transfer of these 10 nm ridges in a LADI process suggests that the resolution of LADI is better than 10 nm.

Figure 6:
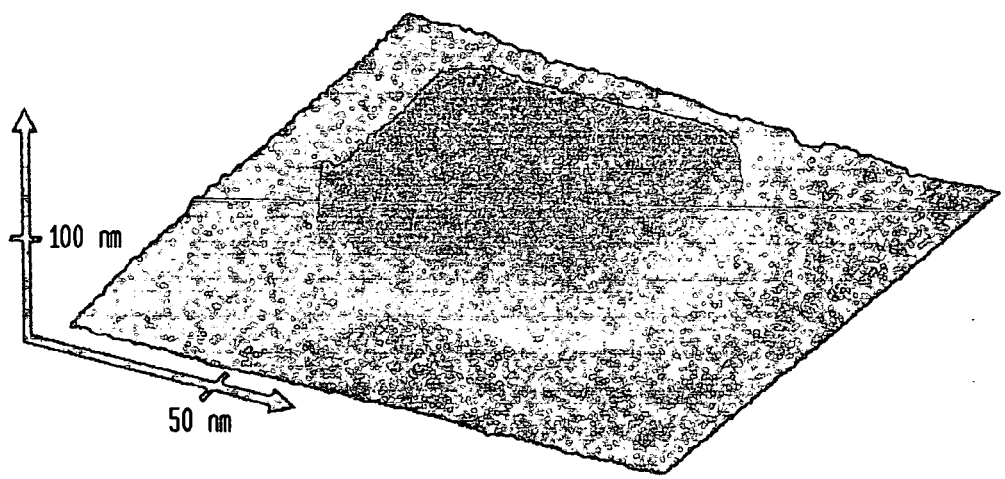
FIG. 6 is an atomic force micrograph of an isolated silicon square pattern produced by the method of FIG. 1.

LADI also results in the imprinting of large, isolated patterns. Typically, LADI can pattern mesas and trenches of over tens of microns in size. FIG. 6 shows a silicon substrate imprinted by LADI with an isolated square mesa having a width of 8 μm and height of 110 nm. The successful imprinting of such large patterns indicates that the molten silicon can easily flow over tens of microns within nanoseconds.

Figure 7:
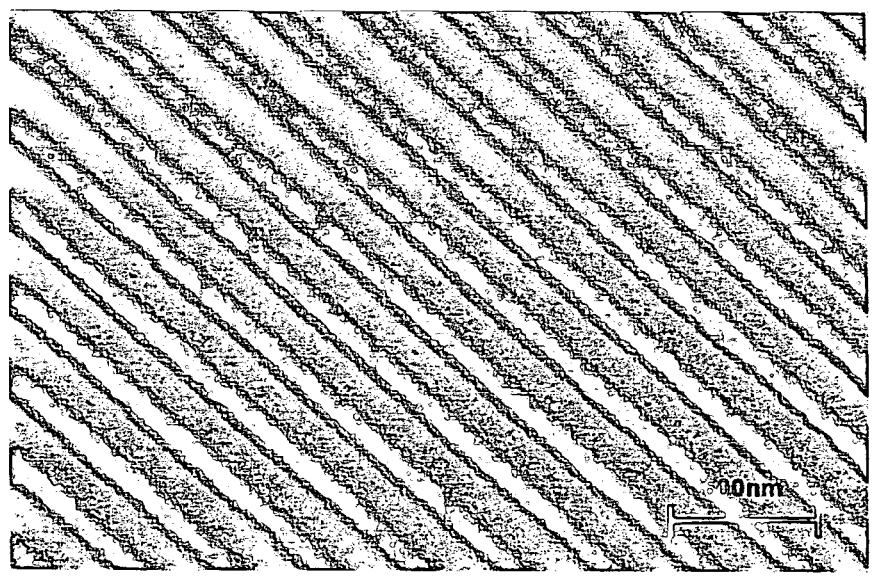
FIG. 7 is a scanning electron micrograph of a quartz mold following two applications of the method of FIG. 1.

FIG. 7 shows a scanning electron micrograph of a quartz mold following two applications of LADI. Notably, the mold shows no visible damage due to the multiple LADI applications.

While UV laser radiation sources are advantageous, depending on the substrate other sources can be used. Infrared lasers can be used to soften or liquefy many metals and even heat lamps can be used to melt or soften many polymers.

If the surface to be imprinted comprises a plurality of layers, a combination of layers can be imprinted at the same time. The radiation can be chosen to melt a layer of material that can melt, through heat transfer, adjacent layers.

The pulse duration of the radiation can be selected upon the imprint process and the pulse can be short enough so that only the surface layer of the substrate being heated and the rest of the substrate as well as the mold will not be heated significantly.

It is also possible that there are pre-fabricated patterns on the substrate and there is alignment between the pattern on the substrate and the pattern on the mold.

The equipment for laser assisted direct imprint can have alignment capabilities comprising stages for the substrates and mold respectively and also the mechanical stage to create the relative movement between the substrates and the mold in x, y, z, zeta, tilt and yank (all possible degrees of freedom). The sensors can monitor the relative movement between the substrates and the mold as well as monitoring the imprint heating pressure and information of the imprint controller would have monitoring feedback and control system.

It is contemplated that the above-described method can be used in a series of steps to form complex structures. A substrate can have an existing pattern, and the pattern on the mold can be aligned in relation to the existing substrate pattern before imprinting. A substrate can be patterned as described, a layer can be added and planarized if necessary, and the added layer can be patterned in the same manner but in a different configuration. Multiple successive layers can be imprinted with aligned patterns to form complex devices in the same manner that integrated circuits are formed. The substrate can comprise a thin layer of radiation absorbing material on a substrate transparent to the radiation. This method can be used with a polymer coated substrate to imprint a pattern into resists and then use the patterned resist to pattern the substrates as described in U.S. Pat. No. 5,772,905.

Moreover the process can be used to make many devices on the same substrate using step and repeat imprinting and automatic alignment techniques well known in the art.

The imprinted substrates can have recessed regions that will hold patterns of material added after the imprinting. The added material can be magnetic or conductive to form tiny electromagnetic components. The recessed regions can even act as microscale or nanoscale molds for the fabrication of tiny components.

Microscale or nanoscale grooves can be imprinted into the substrate to select, orient and direct macromolecules, and imprinted peaks or recesses can be provided for attachment of indicators that will selectively attach to target molecules.

It is to be understood that the above described embodiments are illustrative of only a few of the many embodiments which can represent applications of the invention. Numerous and varied other arrangements can be made by those skilled in the art without departing from the spirit and scope of the invention.

What is claimed is:

1. A method of directly imprinting a mold pattern on the surface of a substrate comprising the steps of:
   providing a solid substrate having a surface to be imprinted, the surface to be imprinted comprising a material selected from the group consisting of semiconductors, metals, semimetals, alloys, ceramics and insulators;

providing a mold having a molding surface to imprint the pattern;

disposing the mold near the substrate with the molding surface adjacent the substrate surface to be imprinted;

irradiating the substrate surface with radiation to soften or liquefy the substrate surface;

pressing the molding surface into the softened or liquefied substrate surface; and removing the molding surface from the substrate to leave the substrate with the imprinted pattern of the molding surface.

2. The method of claim 1 wherein the radiation is laser radiation.

3. The method of claim 1 wherein the laser radiation is of wavelength in range 1 nanometer to 100 micrometers.

4. The method of claim 1 wherein the radiation is lamp radiation.

5. The method of claim 4 wherein the lamp radiation is predominantly in the range 1 nanometer to 50 micrometers.

6. The method of claim 1 wherein the irradiation is pulsed.

7. The method of claim 6 wherein the irradiation is pulsed with a time duration in the range 1 nanosecond to 10 seconds.

8. The method of claim 6 wherein the irradiation is pulsed repeatedly while the mold is pressed against the substrate.

9. The method of claim 1 wherein the radiation heats a surface layer of the substrate without substantially heating the mold or the entire substrate.

10. The method of claim 1 wherein the mold comprises material transparent to the radiation.

11. The method of claim 1 wherein the mold comprises fused quartz.

12. The method of claim 1 wherein the molding surface comprises a pattern of projecting and recessed features having at least one feature with a minimum dimension of less than 200 nanometers.

13. The method of claim 1 wherein the molding surface comprises a pattern of projecting and recessed features having a mold depth of less than 250 nanometers from the outer portion of a projecting feature to the inner portion of an adjacent recessed region.

14. The method of claim 1 wherein the substrate surface is irradiated with ultraviolet laser radiation.

15. The method of claim 1 wherein the molding surface is pressed into the substrate surface by a mechanical press or by fluid pressure.

16. The method of claim 1 wherein the molding surface is flat to planarize the surface of the substrate.

17. The method of claim 1 wherein the mold is formed of material transparent to ultraviolet radiation, the substrate is silicon, and the substrate is irradiated with ultraviolet laser radiation through the mold.

18. The method of claim 1 wherein the substrate surface comprises a semiconductor material.

19. The method of claim 1 wherein the substrate surface comprises a metal or alloy.

20. The method of claim 1 wherein the substrate surface comprises a ceramic.

21. The method of claim 1 wherein the substrate surface comprises a plurality of layers of materials to be molded.

22. The method of claim 1 wherein the radiation is infrared radiation.

23. The method of claim 1 wherein the substrate comprises a previously imprinted layer.

24. The method of claim 1 further comprising the step of filling with material the recessed regions of the imprinted pattern.

25. The method of claim 1 further comprising the step of repeating the imprinting process at another location on the same substrate.

26. The method of claim 1 wherein the substrate comprises an existing pattern and further comprising the step of aligning the pattern on the mold to the existing pattern on the substrate.

27. The method of claim 1 further comprising the step of planarizing the substrate prior to imprinting the substrate.

28. The method of claim 1 wherein the substrate comprises silicon.

29. The method of claim 1 wherein the substrate comprises an insulator.

30. The method of claim 1 wherein the solid substrate comprises a plurality of layers and the surface to be imprinted comprises a thin film of semiconductor.

31. The method of claim 1 wherein the solid substrate comprises a plurality of layers and the surface to be imprinted comprises a thin film of metal.

32. The method of claim 1 wherein the solid substrate comprises a plurality of layers and the surface to be imprinted comprises a thin film of semimetal.

33. The method of claim 1 wherein the solid substrate comprises a plurality of layers and the surface to be imprinted comprises a thin film of alloy.

34. The method of claim 1 wherein the solid substrate comprises a plurality of layers and the surface to be imprinted comprises a thin film of ceramic.

35. The method of claim 1 wherein the solid substrate comprises a plurality of layers and the surface to be imprinted comprises a thin film of insulator.

36. The method of claim 1 wherein the substrate comprises a plurality of layers and the surface to be imprinted is composed of a plurality of surface regions formed of different materials.

37. The method of claim 36 further comprising the steps of adding and imprinting one or more additional layers to the imprinted added layer.

38. The method of claim 36 including the step of planarizing the added layer prior to imprinting the added layer.

39. A method of forming a complex device comprising the steps of:
providing a substrate having a first surface to be imprinted;
imprinting the first surface with a first pattern in accordance with the method of claim 1;
adding a layer to the imprinted surface; and
imprinting the added layer with a second pattern.

40. The method of forming a complex device comprising the steps of:
providing a substrate having a surface imprinted with a first pattern;
adding a layer to the imprinted surface; and
imprinting the added layer with a second pattern in accordance with the method of claim 1.

41. A method of directly imprinting a mold pattern on the surface of a solid substrate comprising the steps of:
providing the solid substrate;
providing a mold having a molding surface to imprint the pattern;
disposing the mold near the substrate with the molding surface adjacent the substrate surface to be imprinted;

irradiating the substrate surface with radiation to soften or liquefy the substrate surface;

pressing the molding surface into the softened or liquefied substrate surface; and removing the molding surface from the substrate surface to leave the substrate with the imprinted pattern of the molding surface, wherein the mold is transparent to the radiation, the substrate surface absorbs the radiation; and the substrate surface is irradiated through the transparent mold.

42. The method of claim 41 wherein the substrate surface to be imprinted is softened or liquefied without softening or liquefying substantially the remainder of the solid substrate.

43. The method of claim 41 wherein the substrate surface is irradiated by a pulsed laser and the pulse of the laser is chosen to selectively soften or liquefy the substrate surface without substantially softening of liquefying substantially the remainder of the solid substrate.

44. The method of claim 41 wherein the solid substrate comprises silicon.

45. A method of directly imprinting a mold pattern on the surface of a silicon substrate without the interposition of a polymer or resist layer comprising the steps of:

providing the silicon substrate;

providing a mold having a molding surface to imprint the pattern;

disposing the mold near the substrate with the molding surface adjacent the surface to be imprinted;

irradiating the substrate surface with ultraviolet radiation to liquefy the substrate surface;

pressing the molding surface into the liquefied substrate surface; and removing the molding surface from the substrate surface to leave the substrate with the imprinted pattern of the molding surface, wherein the mold is transparent to the ultraviolet radiation and the radiation is absorbed at the surface to be molded without liquefying substantially the remainder of the substrate.

* * * * *